(12) United States Patent
Wang et al.

(10) Patent No.: US 6,284,579 B1
(45) Date of Patent: Sep. 4, 2001

(54) DRAIN LEAKAGE REDUCTION BY INDIUM TRANSIENT ENCHANCED DIFFUSION (TED) FOR LOW POWER APPLICATIONS

(75) Inventors: Jyh-Haur Wang; Bi-Ling Lin, both of Hsin-Chu; Chung-Cheng Wu, I-Lan; Carlos H. Diaz, Hsin-Chu, all of (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/418,034

(22) Filed: Oct. 14, 1999

(51) Int. Cl.[7] .................................................. H01L 21/338
(52) U.S. Cl. ......................... 438/179; 438/286; 438/527
(58) Field of Search ................................. 438/179, 223, 438/286, 527, 549

(56) References Cited

U.S. PATENT DOCUMENTS

| 5,753,958 | 5/1998 | Burr et al. | 257/392 |
| 5,757,045 | 5/1998 | Tsai et al. | 257/336 |
| 5,780,192 | 7/1998 | Burr et al. | 257/408 |
| 5,786,620 | 7/1998 | Richards, Jr. et al. | 257/408 |
| 5,923,987 | * 7/1999 | Burr | 438/304 |

OTHER PUBLICATIONS

Stanley Wolf Ph.D. and Richard N. Tauber Ph.D. in Silicon Processing for the VLSI Era, vol. 1: Process Technology, Lattice Press, 1986, pp. 27, 57–58.*

* cited by examiner

Primary Examiner—Wael Fahmy
Assistant Examiner—William M. Brewster
(74) Attorney, Agent, or Firm—George O. Saile; Stephen B. Ackerman; Alek P. Szecsy

(57) ABSTRACT

A method for forming within a substrate employed within a microelectronics fabrication a field effect transistor with attenuated drain leakage current. There is provided a silicon substrate within which are fabricated nMOS field effect transistors (FET) with lightly-doped n-type drain regions (nLDD) employing arsenic (As) dopant. There is then implanted indium (In) dopant atoms adjacent to the As diffused junction to form a p-type pocket therein. There is then avoided the customary high temperature rapid thermal annealing (RTA) step and instead employed a thermal annealing for 2 hours at 750 degrees centigrade, whereupon the implanted indium atom undergo transient enhanced diffusion (TED) to form a graded junction profile, resulting in attenuated drain leakage current and no increased reverse short channel effect from the strong segregation of indium into silicon oxide.

4 Claims, 3 Drawing Sheets

DRAIN LEAKAGE REDUCTION BY INDIUM TRANSIENT ENCHANCED DIFFUSION (TED) FOR LOW POWER APPLICATIONS

BACKGROUND OF THE INVENTION

1. Field of the Invention

The invention relates to the field of microelectronics fabrications. More particularly, the invention relates to the field of microelectronics fabrications employing low power field effect transistor (FET) devices.

2. Description of the Related Art

Microelectronics fabrications may combine various kinds of electronic devices and components within their design. One of the most important kinds of electronic device encountered in modern microelectronics is the field effect transistor (FET), which employs a gate electrode insulated from a conductive channel formed between source and drain electrode regions. In one type of FET commonly employed in modern microelectronics fabrications, the source and drain electrode regions may be fabricated by forming n-type regions in a p-type silicon substrate to form n-type metal oxide silicon field effect transistor (NMOSFET). When fabricated with light n-type doping in the drain region, the n-type lightly doped drain (nLDD) device is commonly employed in integrated circuit microelectronics fabrications where low power dissipation is desired. The complementary type of FET is the pMOS device which employs p-type doped regions for source and drain in an n-type substrate. The pMOS device has somewhat lower current drive capability compared to the nMOS device, but has inherently lower drain leakage current.

Conventional FET device designs are often embellished with doped regions additional to the source and drain regions. Such regions are often formed adjacent to source and/or drain regions by ion implantation, and serve to modify or improve device characteristics. These additional doped regions are referred to as pocket regions, and may be either polarity depending on the particular device and purpose.

For many applications in microelectronics technology where drive current capability with low power dissipation is important, it is desirable to have an nMOS FET with very low drain leakage current. Methods of formation of drain junctions which have low reverse-bias current accomplish this objective, either by the inherent nature of the junction or by utilizing a compensating method such as a pocket region surrounding the drain region. Formation of pocket regions with conventional p-type dopants such as boron are not without problems, such as reverse short channel effects (RSCE), which limit the operation of the FET.

It is thus towards the goal of forming nLDD NMOSFET devices with low drain leakage current and power consumption and reduced reverse short channel effect that the present invention is particularly directed.

Various methods have been disclosed for forming pocket regions adjacent to source or drain regions in a FET device to modify device properties.

For example, Burr et al., in U.S. Pat. NO. 5,753,958, disclose a method for forming a FET with adjustable threshold voltage by employing a pocket region adjacent to source or drain of an FET to adjust the threshold voltage of the FET device. The method employs a voltage applied directly to the pocket region by means of a connection line thereto, and there may be applied a back bias to the device by the same means.

Further, Burr et al., in U.S. Pat. No. 5,780.912, disclose a method for forming a low threshold voltage FET device having an asymmetric threshold voltage. The method employs an implanted halo pocket region under and adjacent to source or drain region of the FET device.

Still further, Tsai et al., in U.S. Pat. No. 5,757,045, disclose a CMOS structure for forming a CMOS FET device with reduced susceptibility to punch-through. The structure employs a dual pocket regions implanted in the channel regions adjacent to source and drain regions.

Finally, Richards, Jr. et al., in U.S. Pat. No. 5,786,620, disclose a method for forming a Fermi-threshold FET device with significantly improved threshold voltage and performance. The method employs an implanted pocket region adjacent to the drain region of opposite conductivity type, which acts as a stop to the drain electric field and prevents drain—source reach-through, increasing short channel performance.

Desirable in the art of FET devices formed within microelectronics fabrications are additional methods for forming FET devices with low drain leakage current and low power consumption.

It is towards these goals that the present invention is generally directed.

SUMMARY OF THE INVENTION

A first object of the present invention is to provide a method for forming a field transistor (FET) with attenuated drain leakage current.

A second object of the present invention is to provide a method for forming in accord with the first object of the present invention, an NMOS NLDD low power field effect transistor with attenuated power dissipation and drain leakage current without increased reverse short channel effect.

A third object of the present invention is to provide a method in accord with the first object of the present invention and the second object of the present invention where the method is readily commercially implemented.

In accord with the objects of the present invention, there is provided a method for forming a field effect transistor (FET) with attenuated drain leakage current. To practice the invention, there is provided a silicon substrate within which are fabricated nMOS field effect transistors (FET) with lightly doped n-type drain regions (nLDD) employing arsenic (As) dopant atoms. There is then implanted indium (In) dopant atoms adjacent to the As diffused junction to form a p-type pocket therein. There is then avoided the customers high temperature rapid thermal annealing (RTA) step between 900 to 1050 degrees centigrade and instead employed a thermal annealing for 2 hours at 750 degrees centigrade, whereupon the implanted indium atoms undergo transient enhanced diffusion (TED) to form a graded junction profile, resulting in attenuated drain leakage current without increased reverse short channel effect (RSCE).

The present invention provides a method for forming a graded n-type pocket employing In as an ion implanted dopant wherein the transient enhanced diffusion (TED) of indium atoms during a thermal annealing step at 750 degrees centigrade forms a graded junction profile with low drain leakage current without increased reverse short channel effect (RSCE).

The present invention employs methods and materials as are well known in the art of microelectronics fabrication, but in a novel order and sequence. The method of the present invention is therefore readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
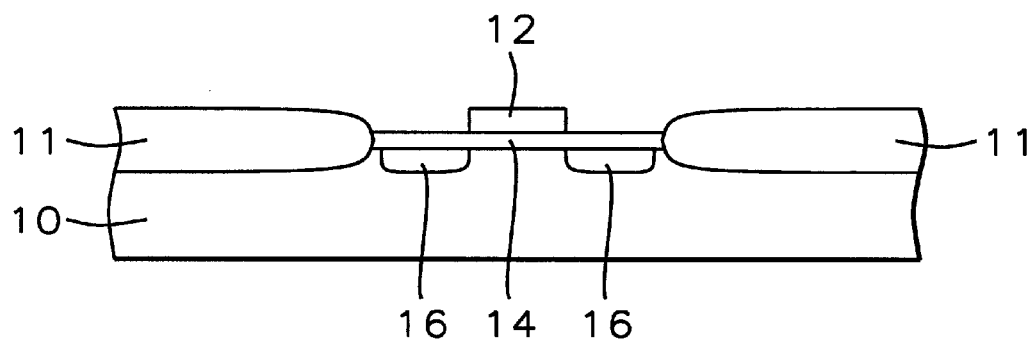
FIG. 1, FIG. 2 and FIG. 3 are directed toward a general embodiment of the present invention. Shown in FIG. 1 to FIG. 3 is a series of schematic cross-sectional drawings illustrating the results of forming upon a silicon substrate employed within a microelectronics fabrication in accord with the present invention a NMOS field effect transistor (FET) with an n-type lightly doped drain (nLDD) region wherein there has been attenuated the drain leakage current by ion implantation of an indium doped pocket adjacent to the drain junction and formation of a graded junction therein by transient enhanced diffusion (TED).

The present invention provides a method for forming a nMOS field effect translator which a silicon substrate employed within a microelectronics fabrication, wherein the n-type arsenic (As) lightly doped drain (nLDD) (region exhibits an attenuated drain leakage current. This result is achieved by formation of a p-type pocket adjacent to the As junction by ion implantation of indium (In) followed by thermal treatment whereby transient enhanced diffusion (TED) of In forms a graded junction profile which provides attenuated drain leakage current without increased reverse short channel effect (RSCE). Referring now to FIG. 1 to FIG. 7, there is shown a series of schematic cross-sectional drawings illustrating the results of forming within a microelectronics fabrication a low power field effect transistor (FET) with attenuated drain leakage current. FIG. 1 shows a microelectronics fabrication at an early stage in its fabrication in accord with the present invention.

Shown in FIG. 1 is a silicon semiconductor substrate 10 employed within a microelectronics fabrication. Formed within the silicon semiconductor substrate are regions of field oxide (FOX) dielectric isolation 11 which isolate one or more field effect transistor (FET) devices consisting of a gate electrode 12 insulated by a gate insulation layer 14 from a channel between a source electrode 16 and drain electrode 18.

With respect to the silicon semiconductor substrate 10 shown in FIG. 1, the silicon semiconductor substrate 10 is the substrate itself employed within the microelectronics fabrication, or alternately the substrate 10 may be any of several microelectronics layers formed upon a substrate. The substrate is employed within a microelectronics fabrication chosen from the group including but not limited to integrated circuit microelectronics fabrications, charge coupled device microelectronics fabrications and optoelectronics display microelectronics fabrications.

With respect to the field effect transistor (FET) structures which comprise the gate electrode 12, the gate insulation layer 14, the source electrode 16 and the drain electrode 18 shown in FIG. 1, the field effect transistor structures are formed employing materials and methods as are known in the art of microelectronics fabrication. Preferably the gate electrode is a silicon or silicide microelectronics material, the gate insulation is a silicon oxide material, and the source and drain electrodes are n-type regions formed by doping a p-type silicon substrate or well with arsenic type dopant.

Figure 2:
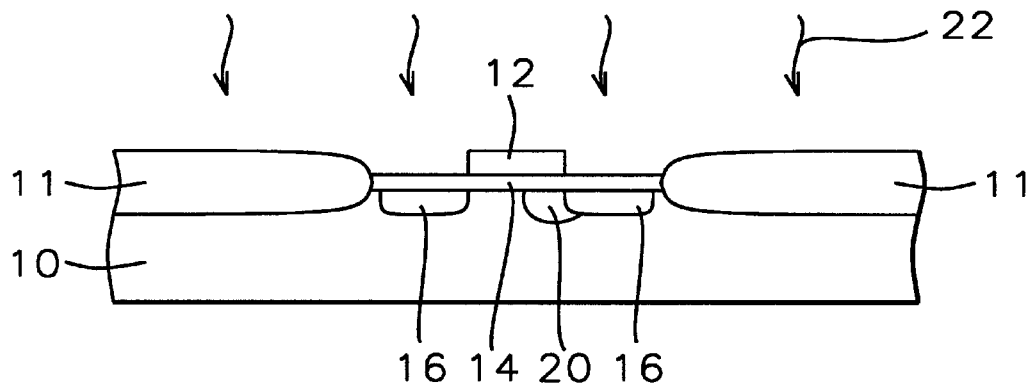

Referring now more particularly to FIG. 2, there is shown a schematic cross-sectional diagram illustrating the result of further processing the integrated circuit microelectronics fabrication whose schematic cross-sectional diagram is shown in FIG. 1 in accord with the method of the present invention. Shown in FIG. 2 is an integrated circuit microelectronics fabrication otherwise equivalent to the integrated circuit microelectronics fabrication shown in FIG. 1, but where there has been formed a p-type doped pocket 20 adjacent to the drain diffusion junction 18 by indium (In) ion implantation 22.

With respect to the p-type doped pocket 20 shown in FIG. 2, the p+-type pocket 20 is formed by ion implantation 22 adjacent to the n-type drain region junction formed by arsenic (As) doping. Preferably the p+-type pocket 20 is formed by ion implantation of indium (In) in accord with the following process. (1) accelerating voltage from about 90 to about 180 kv; (2) ion energy from about 90 to about 180 kEv; (3) ion dose from about 7E12 to about 8E13 per square centimeter. Although not shown in FIG. 2, the p-type doped pocket 20 may be formed adjacent to the n-type source region of the FET device if desired, and this may be advantageous when the FET device geometry is symmetrical.

Figure 3:
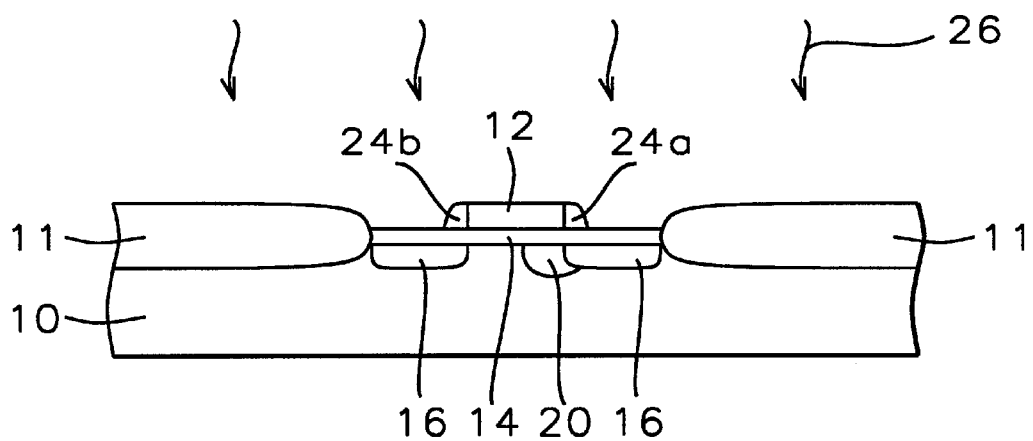

Referring now more particularly to FIG. 3, there is shown a schematic cross-sectional diagram illustrating the results of further processing of the integrated circuit microelectronics fabrication whose schematic cross-sectional diagram is shown in FIG. 2. Shown in FIG. 3 is an integrated circuit microelectronics fabrication otherwise equivalent to the integrated circuit microelectronics fabrication shown in FIG. 2, but where there has been formed spacer dielectric layers 24a and 24b on the sidewalls of the gate electrode 12 and then thermally treated 26 the substrate to induce transient enhanced diffusion of In atoms to provide a graded junction profile.

With respect to the dielectric spacer layers 24a and 24b shown in FIG. 3, the dielectric spacer layers 24a and 24b are silicon nitride dielectric layers formed employing low pressure chemical vapor deposition (LPCVD) from silane ($SiH_4$) and ammonia ($NH_3$) gases.

With respect to the thermal treatment 26 afforded the substrate shown in FIG. 3, the thermal treatment 26 is performed at a temperature between about 550 to about 850 degrees centigrade for a period of time of from about 1 minute to about 40 hours. Preferably the thermal treatment 26 is carried out at a temperature of 750 degrees centigrade for a period of about 2 hours. Alternatively the thermal treatment may also be provided by the processing conditions employed to deposit the gate electrode dielectric spacer layer 24a and 24b, which may be carried out at temperatures of from about 600 to about 850 degrees centigrade. All the preferred thermal treatments are in a temperature range to bring about transient enhanced diffusion (TED) of indium to form a graded junction profile. Avoided are high temperatures characteristic of rapid thermal annealing (RTA), which are above about 1000 degrees centigrade, as the latter higher temperatures reduce transient enhanced diffusion (TED) of indium due to annealing of ion implantation damage and do not permit forming a graded indium junction profile.

The method of the present invention may be extended to form the drain and pocket regions simultaneously by co-implantation of As and In ions employing the gate electrode as a mask, and subsequently co-diffusing the dopant As and In atoms. The higher implant energy of In compared to As may provide a p+ pocket beyond the As drain junction. By avoiding the conventional rapid thermal annealing at temperatures above about 1000 degrees centigrade and employing instead temperatures comparable to the range for indium anomalous transient enhanced diffusion (TED), the beneficial effects of attenuated drain leakage current may be obtained, and no increased reverse short channel effect (RSCE) is observed.

The present invention provides a method for forming a low power NMOS field effect transistor with attenuated drain leakage current, employing an indium ion implanted p+-pocket adjacent to the drain region wherein the indium junction profile is formed as a graded junction by transient enhanced diffusion (TED) of indium during a thermal treatment between about 550 and 850 degrees centigrade.

The method of the present invention employs indium as a p-type dopant for forming drain regions of an FET. This affords an additional advantage in providing a reverse short channel effect (RSCE) which is less than compared to conventional drain regions formed employing boron as the p-type dopant. The mechanisms of reverse short channel effect are well known, and it is due to the surface pile-up of boron dopant atoms. Indium atoms exhibit strong segregation into silicon oxide, thus avoiding the surface pile-up as well as a large reverse short channel effect.

Experimental

Figure 4:
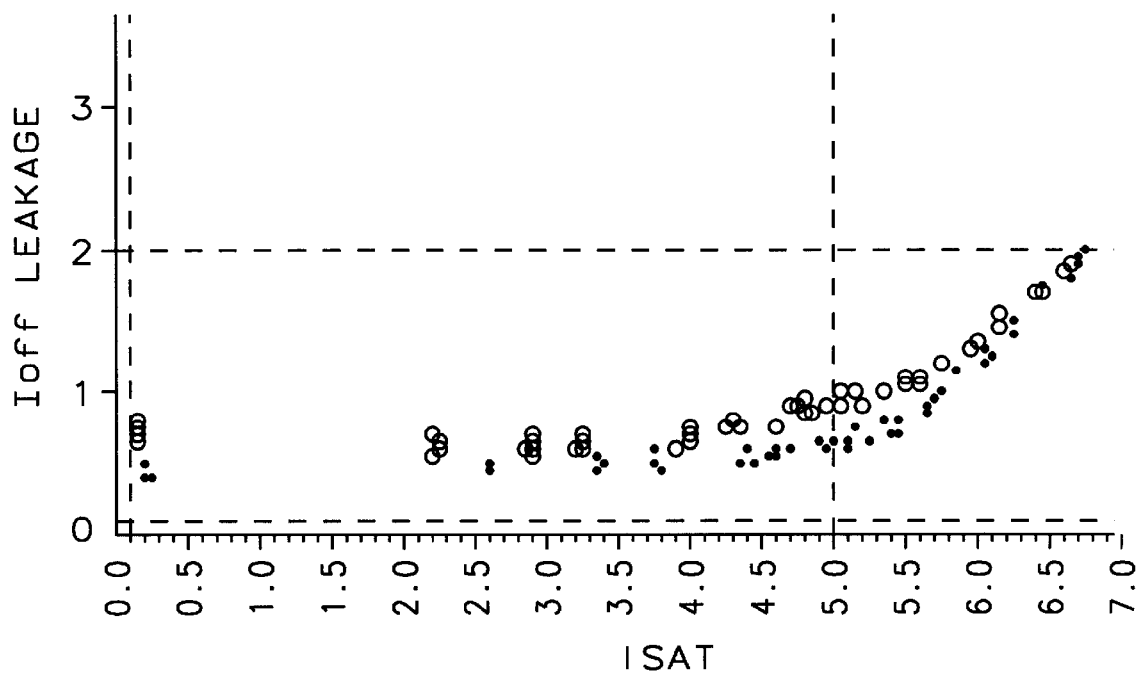
FIG. 4 and FIG. 5 are graphs showing the change in threshold voltage $V_t$ for FET devices with channel gate length and the change in drain leakage current $I_{off}$ with saturation current $I_{sat}$ for FET devices manufactured according to the conventional state of the art, employing boron or undiffused indium pockets.
Figure 6:
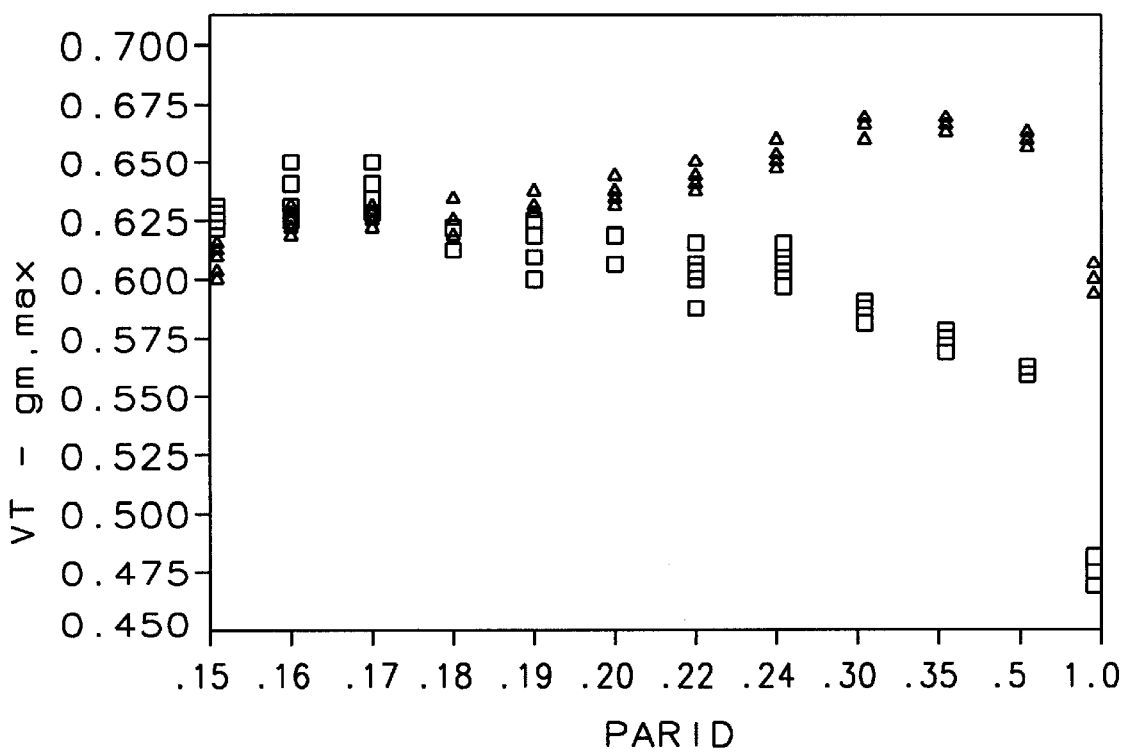
FIG. 6 and FIG. 7 are graphs showing the change in threshold voltage $V_t$ for FET devices with channel gate length and the change in drain leakage current $I_{off}$ with saturation current for FET devices manufactured in accord with the method of the present invention.

The benefits and advantages of the present invention are observed in the experimental results obtained on samples of NMOS field effect transistor devices fabricated employing various methods and compared with the method of the present invention. In the first sample, the experimental device fabrication employed indium implantation under the following process conditions: (1) implant energy 130 kEv; (2) implant dose 3E13 per square centimeter. After implant, there was carried out a conventional rapid thermal anneal (RTA) at 900 degrees centigrade with no lower temperature transient enhanced diffusion step. The control samples were fabricated with boron doped p-type pocket. The drain leakage current was measured for both types of devices as a function of saturation drain current $I_{sat}$ for different channel gate lengths. The results are shown in FIG. 4. It can be seen that the drain leakage is considerably attenuated for the boron doped samples compared with the devices with undiffused indium doped pockets. FIG. 6 shows threshold voltage $V_t$ as a function of channel gate length. It is seen that reverse short channel effect is large for boron doped sample compared to indium doped sample.

Figure 5:
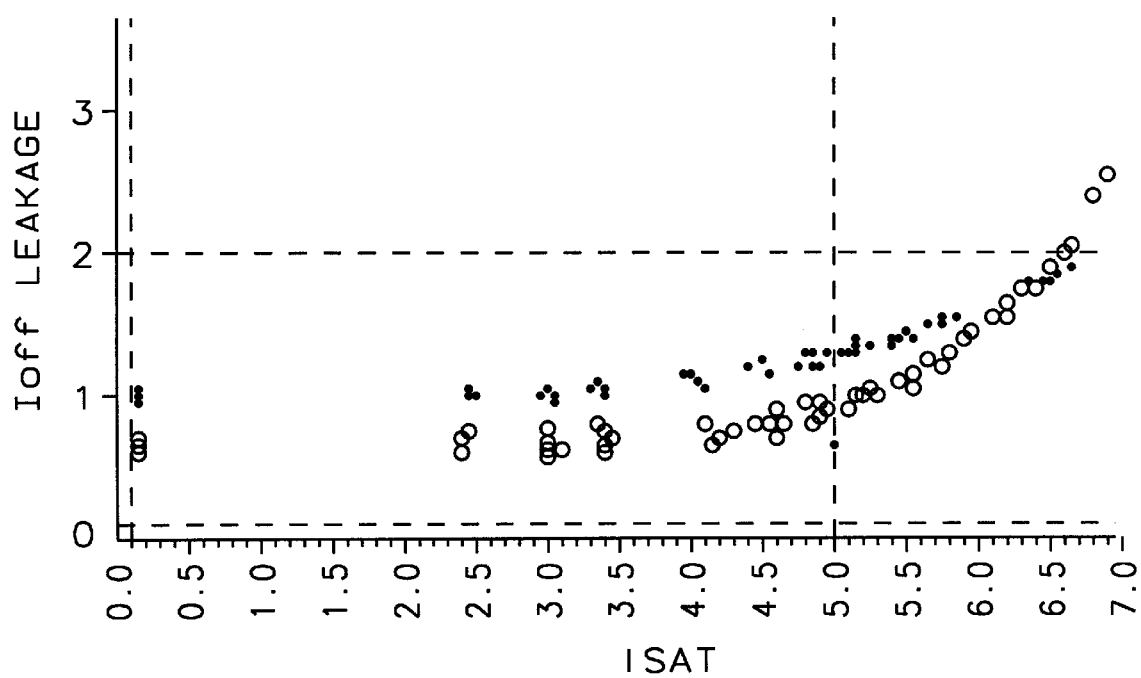
Figure 7:
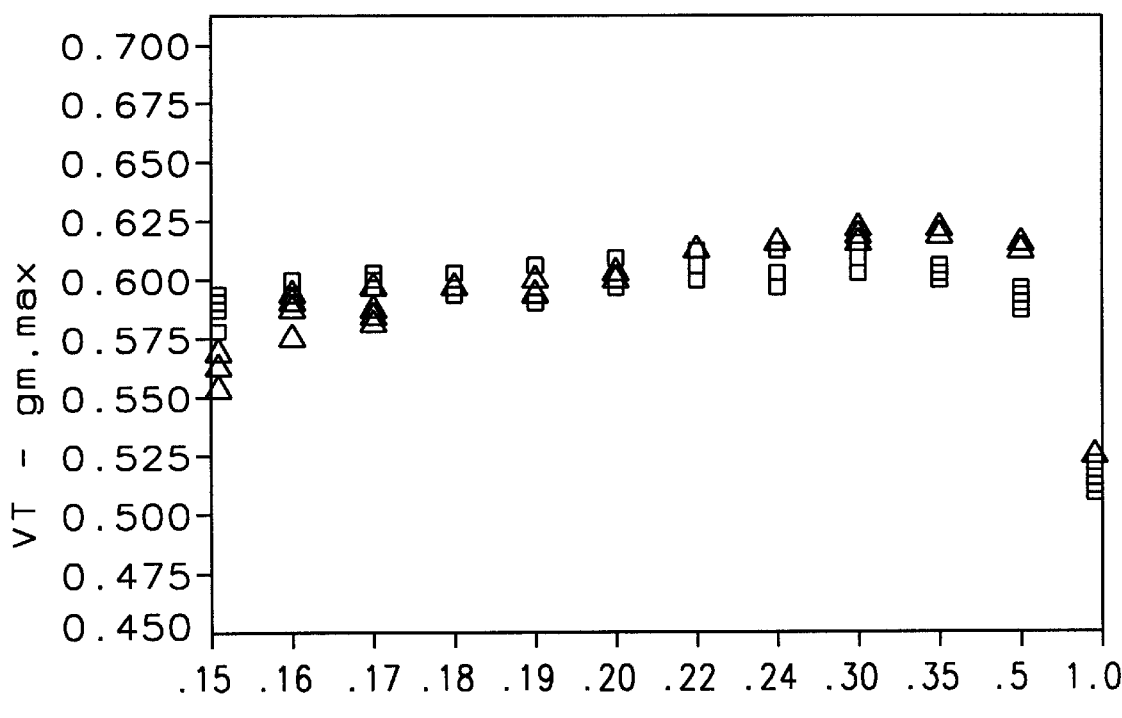

In the second example, indium doped sample with and without TED are compared in FIG. 5 and FIG. 7. In FIG. 5, a significant reduction of drain leakage current is observed in transient induced diffused (TED) indium sample compared to the sample without TED. It is of greater importance that the reverse short channel effect is not more severe in the sample with indium TED as shown in FIG. 7. This is due to the strong segregation effect of indium into silicon oxide. Thus, low drain leakage current may be obtained simultaneously without large reverse short channel effect (RSCE).

As is understood by a person skilled in the art, the preferred embodiment of the present invention is illustrative of the present invention rather than limiting of the present invention. Revisions and modifications may be made to materials, structures and dimensions through which is provided the preferred embodiment of the present invention while still providing embodiments which are within the spirit and scope of the present invention, as defined by the appended claims.

What is claimed is:

1. A method for forming within a silicon substrate employed within an integrated circuit microelectronics fabrication a field effect transistor with attenuated drain leakage comprising:

providing a silicon semiconductor substrate;

forming within and upon the silicon semiconductor substrate a gate electrode pattern;

simultaneously implanting arsenic and indium atoms within the silicon semiconductor substrate employing the gate electrode pattern as an ion implant mask;

thermally treating the silicon semiconductor substrate to diffuse the arsenic and indium atoms to form respectively the n-type source and drain regions and the adjacent p-type pocket regions and a graded indium junction profile.

2. The method of claim 1 wherein the graded indium junction results in attenuated drain leakage current.

3. The method of claim 1 wherein the graded indium junction profile results in no increase in reverse short channel effect.

4. The method of claim 1 wherein the thermal treatment is carried at a temperature below about 1000 degrees centigrade.

* * * * *